(12) United States Patent
Wu et al.

(10) Patent No.: US 10,609,844 B1
(45) Date of Patent: Mar. 31, 2020

(54) POWER CONVERTER

(71) Applicant: Hong Kong Applied Science and Technology Research Institute Company Limited, Hong Kong (CN)

(72) Inventors: Kun Wu, Shenzhen (CN); Ziyang Gao, Hong Kong (CN); Danting Xu, Hong Kong (CN)

(73) Assignee: HONG KONG APPLIED SCIENCE AND TECHNOLOGY RESEARCH INSTITUTE COMPANY LIMITED, Hong Kong (CN)

( * ) Notice: Subject to any disclaimer, the term of this patent is extended or adjusted under 35 U.S.C. 154(b) by 0 days.

(21) Appl. No.: 16/266,104

(22) Filed: Feb. 3, 2019

(51) Int. Cl.
| | | |
|---|---|---|
| H05K 7/20 | (2006.01) |
| H02M 1/14 | (2006.01) |
| H02M 1/34 | (2007.01) |
| H05K 1/18 | (2006.01) |
| H05K 1/02 | (2006.01) |
| H05K 7/14 | (2006.01) |
| H05K 1/14 | (2006.01) |

(52) U.S. Cl.
CPC .............. *H05K 7/209* (2013.01); *H02M 1/14* (2013.01); *H02M 1/34* (2013.01); *H05K 1/0204* (2013.01); *H05K 1/028* (2013.01); *H05K 1/14* (2013.01); *H05K 1/181* (2013.01); *H05K 7/1427* (2013.01); *H02M 2001/344* (2013.01); *H05K 2201/047* (2013.01); *H05K 2201/10053* (2013.01); *H05K 2201/10545* (2013.01)

(58) Field of Classification Search
CPC .......... H05K 7/209; H05K 3/366; H02M 1/14
See application file for complete search history.

(56) References Cited

U.S. PATENT DOCUMENTS

| | | | |
|---|---|---|---|
| 9,548,255 B1 * | 1/2017 | Ge | H01L 23/49861 |
| 9,807,914 B2 * | 10/2017 | Liu | H05K 1/028 |
| 9,867,285 B2 * | 1/2018 | Martinez | H05K 1/0295 |
| 9,955,582 B2 | 4/2018 | Kuhlman et al. | |
| 10,064,276 B2 | 8/2018 | Williams et al. | |
| 2015/0076700 A1 | 3/2015 | Yap | |
| 2017/0060151 A1 * | 3/2017 | Vaisband | G05F 1/46 |
| 2017/0301654 A1 | 10/2017 | Frenette et al. | |
| 2017/0365957 A1 * | 12/2017 | Francisco | H01R 13/665 |

FOREIGN PATENT DOCUMENTS

| | | |
|---|---|---|
| CN | 103594432 | 3/2016 |
| CN | 208461680 U | 2/2019 |
| JP | 2017084961 A | 5/2017 |
| WO | 2018125486 A1 | 7/2018 |

\* cited by examiner

*Primary Examiner* — Mukundbhai G Patel
(74) *Attorney, Agent, or Firm* — Eagle IP Limited; Jacqueline C. Lui

(57) ABSTRACT

Example embodiment is a power converter that adopt a 3D structure to increase the power density and improve thermal performance. The power converter includes a bottom substrate and at least one side substrate. Both the bottom substrate and the side substrate are rigid. Each side substrate is connected with the bottom substrate by a flexible substrate and forms an angle with the bottom substrate. The bottom substrate is further electrically connected with a plurality of surface mounting devices which are rigid. The flexible substrate provides electrical connection between the bottom substrate and the side substrate.

16 Claims, 7 Drawing Sheets

US 10,609,844 B1

POWER CONVERTER

FIELD OF INVENTION

The present invention relates to a power converter, in particular relates to a DC/DC power converter.

BACKGROUND OF INVENTION

Today's latest FPGAs, processors, ASICs and associated memories have raised the performance requirement significantly on the point-of-load (POL) power converter solutions. The power density and thermal performance of the power converter has a direct effect on the system's derating performance and reliability. New power converters with improved performance are desirable for advancing the technology and meeting the needs of power consumption.

SUMMARY OF INVENTION

On example embodiment is a power converter that includes a bottom substrate and at least one side substrate. Both the bottom substrate and the side substrate are rigid. The bottom substrate is electrically connected with a plurality of surface mounting devices which are rigid. Each side substrate is connected with the bottom substrate by a flexible substrate and forms an angle with the bottom substrate. The flexible substrate provides electrical connection between the bottom substrate and the side substrate.

One example embodiment provides a power converter that includes a plurality of surface mounting devices, a bottom substrate, two side substrates, a circuit board, at least two power switching devices, a heat spreader and a housing. The plurality of surface mounting devices is rigid and of the same height. The bottom substrate is rigid and is configured to be fixed on a circuit board by the plurality of surface mounting devices. The surface mounting devices provide electrical connection between the circuit board and the bottom substrate. The two side substrates are rigid and connected to sides of the bottom substrate symmetrically by two flexible substrates. Each side substrate forms an angle of 90° with the bottom substrate. The at least two power switching circuits are mounted on each of the side substrates respectively and receive power through the two flexible substrates and the plurality of the surface mounting devices. The housing encapsulates the circuit board, the bottom substrate, the flexible substrates, the side substrates, the plurality of surface mounting devices and the at least two power switching circuits. The heat spreader is embedded between the two side substrates and has a surface that forms part of the housing exposing to an outside of the power converter for dissipating heat.

An example embodiment is a power converter that has a 3D structure for increasing power density and improving thermal performance. The power converter includes a bottom substrate, four flexible substrate, four side substrates, four power switching circuits and a heat spreader. The bottom substrate is rectangular and rigid. The four flexible substrates are connected symmetrically with the bottom substrate at the four sides of the bottom substrate, and the four side substrates are electrically connected with the bottom substrate by the flexible substrates. Each side substrate forms an angle of 90° with the so bottom substrate. The four power switching circuits are mounted on each of the four side substrates. A heat spreader is embedded in space formed by the bottom substrate and the side substrates to dissipate heat to outside of the power converter.

DETAILED DESCRIPTION

Figure 1:
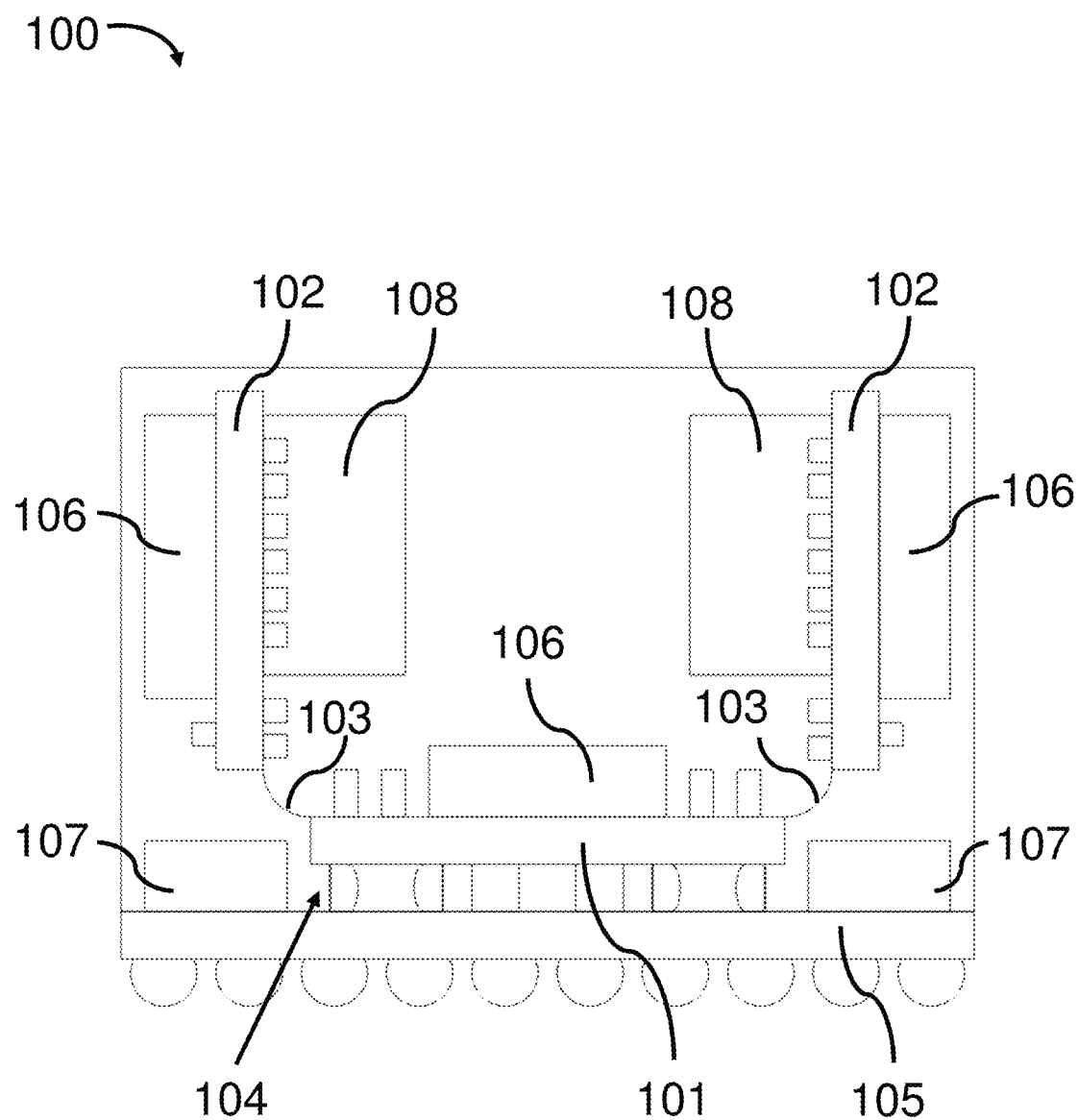
FIG. 1 is a section view of a power converter in accordance with an example embodiment.

As used herein and in the claims, "connect" refers to coupling or connection either directly or indirectly via one or more means.

As used herein, "point-of-load converter" is an example of power module of non-isolated DC/DC type for providing power directly to the load.

As used herein, "power density" refers to the amount of power per unit volume.

Example embodiments relates to DC/DC power converters that have higher power density and better thermal performance than conventional power converters by employing a compact 3D structure.

Point of load converters are key components in CPU, GPU, FPGA etc. to provide power directly to a load. The increasing integration of the large scale integrated circuits demand the power converters to provide as much energy as possible in a module whose size is as small as possible, i.e., high power density is desirable for the power converters.

Utilizing unwanted space to reduce the system size is one way of increasing the power density of a power converter. However, the planar design of a conventional power converter has a limited surface area for mounting the electrical components, therefore no much spare room can be made to reduce the size. Even if switching circuits can be placed in such a crowded space, thermal dissipation and electromagnetic compatibility would become very poor.

Example embodiments solve the above-stated problems or difficulties by using a 3D design including a bottom substrate and at least one side substrate in the power converter, wherein the side substrate is connected and form an angle with the bottom substrate via a flexible substrate that is bendable. As a result, the surface area that the power converter occupies on the PCB board is mostly determined by the size of the bottom substrate, while additional power switching devices can be mounted on the side substrate so that the power density of the power converter can be greatly increased.

Example embodiments further improves thermal dissipation by mounting the heating devices in the converters, such as the power or control ICs, at the side substrates facing outside of the power converter, so that the heat can be dissipated through the side walls of the housing. Further, the power or control ICs mounted on the side substrates may have a surface exposing outside of the power converter and forming part of the housing to accelerate heat spreading. In no an alternative way, a heat spreader is embedded in the space formed between the bottom substrate and the side substrate to dissipate heat. Example embodiment can thus achieve better thermal performance than benchmark even more switching circuits and control ICs are included therein.

In one example embodiment, the bottom substrate is configured to be fixed on a PCB board by a plurality of surface mounting devices (SMDs). The SMDs are selected to be of the same height so that they provide a more precise height control between the bottom substrate and the PCB board than ordinary spacers, which prevents heat concentration around the components with loose interconnections that could result in failure of the power converter. As a part of the power converter, the SMDs also work as redundant electrical paths between the bottom substrate and the PCB board to improve the reliability of the power converter.

FIG. 1 shows a section view of a power converter 100 in accordance with an example embodiment.

Referring now to FIG. 1, the power converter 100 includes a bottom substrate 101 and two side substrates 102. Both the bottom substrate 101 and the side substrates 102 are rigid. The bottom substrate 101 is connected with each side substrate 102 by a flexible substrate 103. The power switching circuits 106 and other passive components 108 are mounted on the bottom substrate 101 and the side substrates 102. The flexible substrates 103 are bendable such that the bottom substrate 101 can form an angle with each side substrates 102 to make a 3D structure, which enables accommodation of more electronic components inside the power converter per surface area of the circuit board 105 than conventional power converter of planar design. Both the bottom substrate 101 and the side substrate 102 have a thickness greater than the flexible substrate 103 to allow more space for control ICs 107 to be mounted on the circuit board 105. The bottom substrate 101 is connected with a plurality of SMDs 104. The SMDs 104 are rigid and of the same height for providing height control when the bottom substrate 101 is stacked on the circuit board 105 so as to provide desirable interconnections therebetween.

In an example embodiment, the number of the side substrates 102 can be one, three, four or more.

In one example embodiment, the SMDs 104 further provide electrical connection between the bottom substrate 101 and the circuit board 105. By way of example, the SMDs 104 can be arrays to function as power I/O interfaces, such as input/output capacitors or snubber circuits. In one example embodiment, the SMDs 104 serve as redundant electrical paths to improve the reliability of the power converter 100.

In one example embodiment, the flexible substrates 103 provide electrical connection between the bottom substrate 101 and the side substrates 102 besides the mechanical connection. Electrical connection via the flexible substrates 103 instead of using additional connecting components saves the space in the power converter 100. The flexible substrates 103 can further provide redundant current paths and thermal transfer so that the reliability of the power converter 100 is increased. By way of example, one or more power switching circuits 106 are mounted on the bottom substrate 101 and/or the side substrate 102 and the power switching circuits 106 on the side substrate 102 are powered through the flexible substrate 103.

In one example embodiment, the power switching circuit 106 mounted on the side substrate 102 includes a power management IC that faces towards an outside of the power converter 100 so that the heat generated by the power management IC can be dissipated quickly and would not be accumulated inside the power converter 100 resulting in irreversible damages caused by overheating.

In one example embodiment, the angle between the bottom substrate 101 and the side substrate 102 is in the range of 30° to 150°. In another example embodiment, the angle between the bottom substrate 101 and the side substrate 102 is 90° so that the power converter 100 occupies a planar area on the circuit board 105 slightly larger than the size of the bottom substrate 101. The power density of the power converter 100 is therefore increased by integrating more power switching circuits 106 per space in comparison with the conventional power converters.

Figure 2:
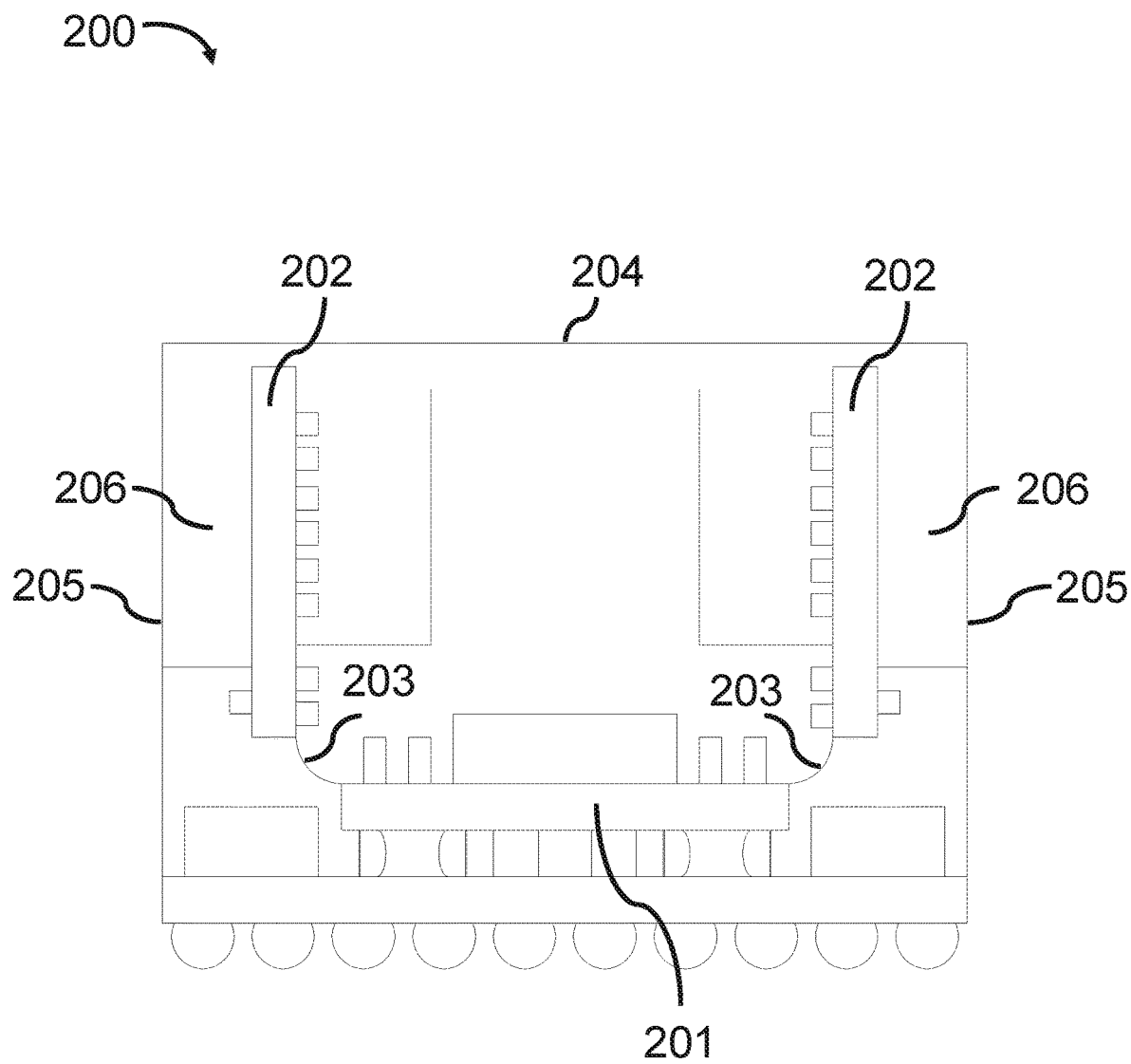
FIG. 2 is a section view of a power converter in accordance with an example embodiment.

FIG. 2 shows a section view of a power converter 200 in accordance with an example embodiment.

Referring to FIG. 2, the power converter 200 includes a bottom substrate 201 and two side substrates 202. Both the bottom substrate 201 and the side substrates 202 are rigid. The bottom substrate 201 is connected with the side substrates 202 at two opposite sides by the flexible substrate 203. The angle between the bottom substrate 201 and each side substrate 202 is 90°. Each side substrate 202 is mounted with a power management IC 206. The power converter 200 further includes a housing 204 that encapsulates the bottom substrate 201, the side substrates 202, the flexible substrates 203 and the electronic components that are mounted on the bottom substrate 201 and the side substrates 202. Each power management IC 206 mounted on the side substrate 202 has a surface 205 that forms a part of the housing 204 and exposes to an outside of the power converter 200 so that the heat of power management IC 206 can be dissipated outside of the power converter 200 efficiently.

In an example embodiment, the housing 204 is made of epoxy molding compound (EMC), which effectively protects the power converter 200 from the influence of various factors in the external environment, such as moisture, heat, and shock.

Figure 3:
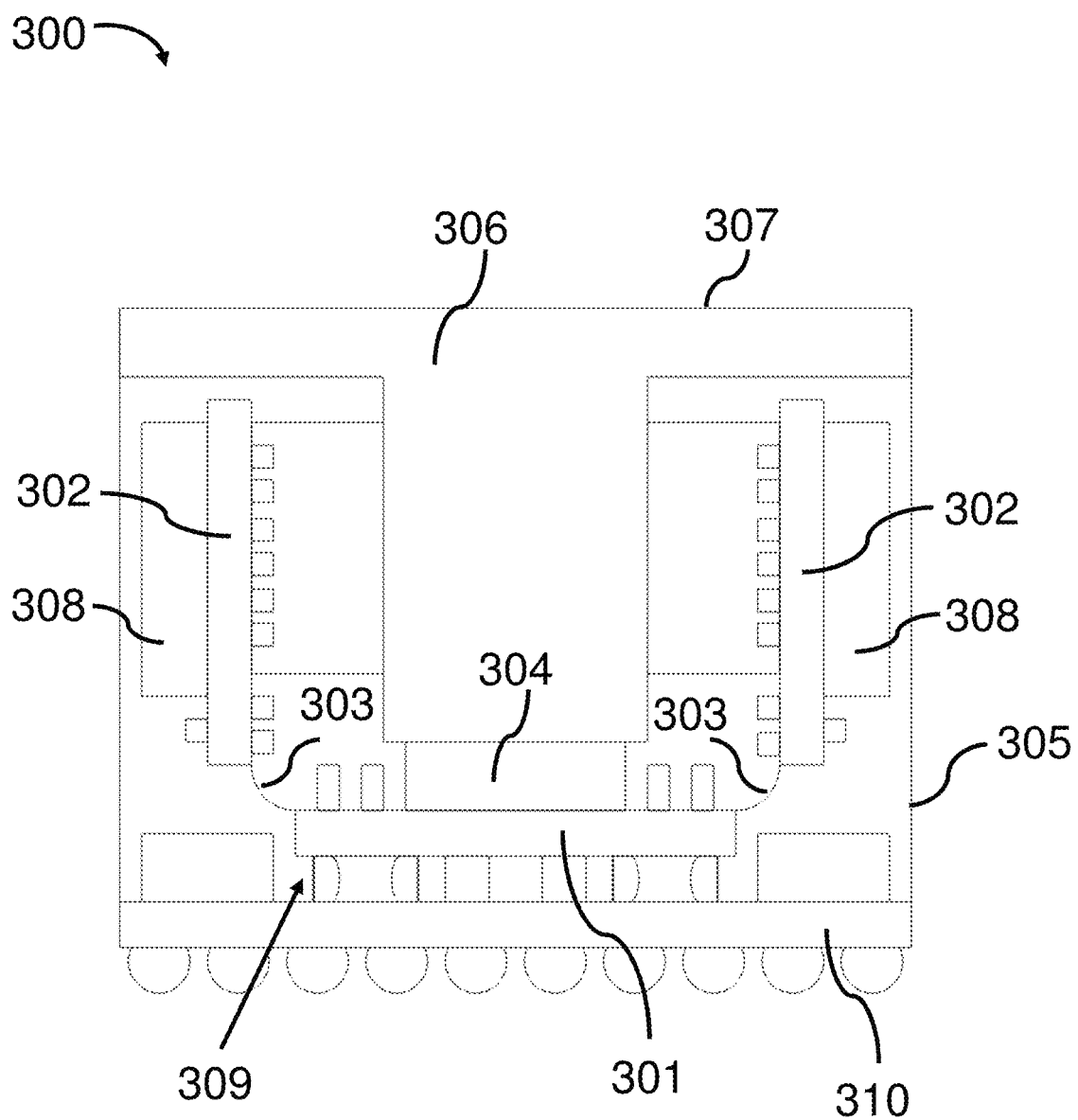
FIG. 3 is a section view of a power converter in accordance with an example embodiment.

FIG. 3 shows a section view of a power converter 300 in accordance with an example embodiment.

In FIG. 3, the power converter 300 includes a bottom substrate 301 and two side substrates 302. Both the bottom substrate 301 and two side substrates 302 are rigid. The bottom substrate is fixed on a circuit board 310 by a plurality of SMDs 309 that are rigid and of the same height. The surface mounting devices 309 serve as height control spacers between the circuit board 310 and the bottom substrate 301 and provide electrical connection therebetween. As the size of the SMDs 309 can be of high precision, e.g. the error can be as low as 0.1 mm, they can provide precise height control for the stacked substrates or circuit boards, which leads to a good interconnection and avoid contact failure between the bottom substrate 301 and the circuit board 310, and thus enhance reliability of the power converter 300. The SMDs 309 can further function as electrical connection between the bottom substrate 301 and the circuit board 310 in order to provide reductant current path to increase the efficiency, heat transfer and system reliability for the power converter 300.

The bottom substrate 301 is connected with the side substrates 302 symmetrically at two opposite sides by the flexible substrate 303. The angle between the bottom substrate 301 and the side substrates 302 is 90°. Two power switching circuits 308 are mounted on each of the side substrates respectively. The power for the power switching circuits 308 is transferred through the flexible substrates 303 and the plurality of the surface mounting devices 309 from the bottom substrate 301. The active components in the power switching circuits 308 such as the power packages or inductors are arranged to face the outside of the power converter 300.

A power management IC 304 is mounted on the top surface of the bottom substrate 301. A heat spreader 306 is positioned in contact with the power management IC 304 and embedded in the space between the side substrates 302 and the housing 305 to dissipate the internal heat generated by the power management IC 304 and other electronic components enclosed in the power converter 300 to the outside of the power converter 300. The heat spreader 306 further has a surface 307 that exposes outside of the housing 305 and forms a part of the housing 305 so that the heat inside the power converter 300 including the heat generated by the power management IC 304 can be dissipated outside of the power converter 300 efficiently.

Figure 4:
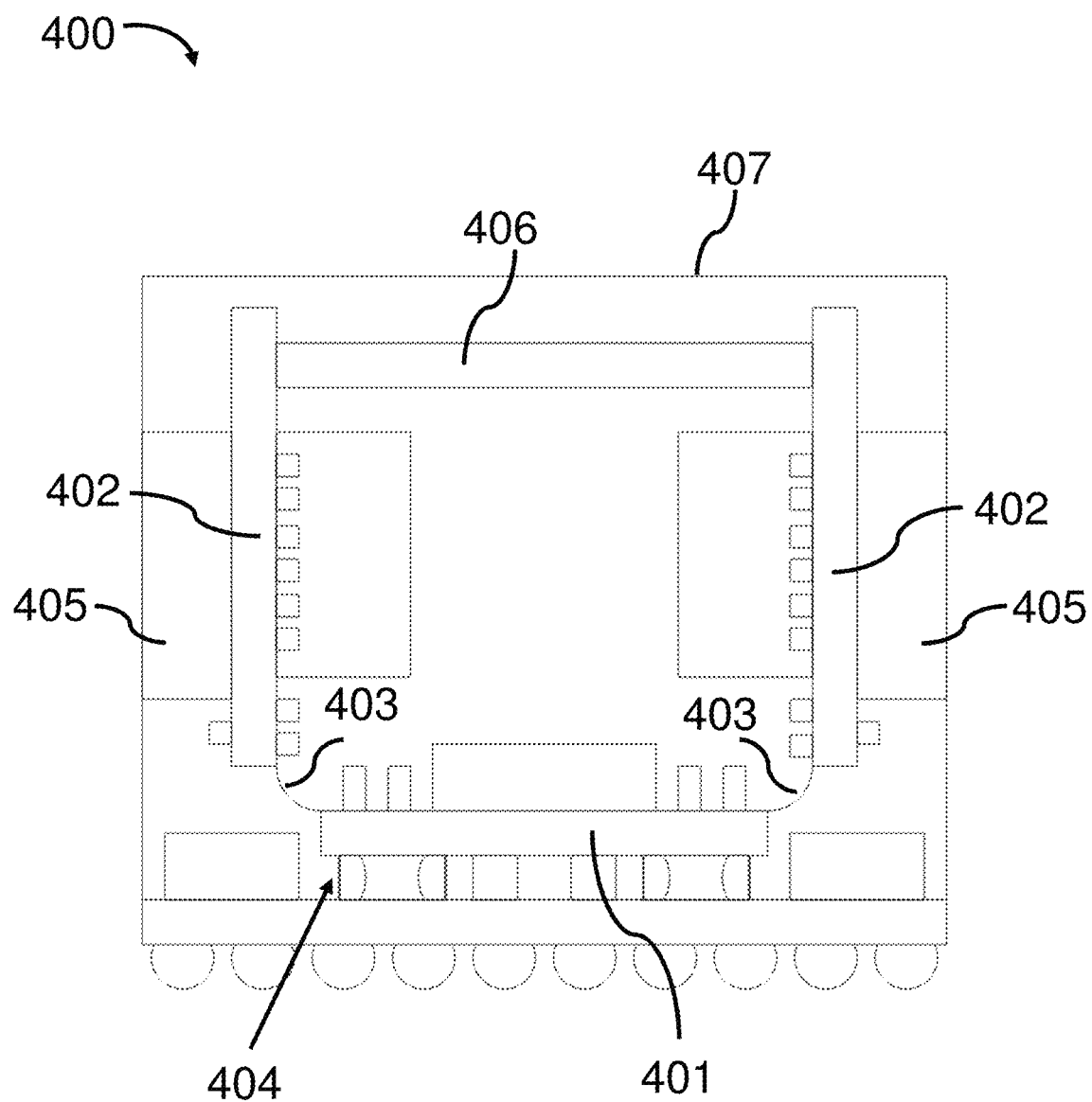
FIG. 4 is a section view of a power converter in accordance with an example embodiment.

FIG. 4 shows a section view of a power converter 400 in accordance with an example embodiment.

The power converter 400 includes one bottom substrate 401 and two side substrates 402, which are connected by the flexible substrate 403 and forms an angle of 90°. The flexible substrate 403 provides electrical connection between the bottom substrate 401 and the side substrate 402. The bottom substrate 401 is connected with a plurality of SMDs 404 of the same height for height control when it is stacked on a PCB board.

The switching circuits 405 are mounted on each of the side substrates 402. A housing 407 encapsulates the bottom substrate 401, the side substrates 402, the flexible substrate 403 and the electronic components mounted thereon. Each switching circuit 405 includes a power management IC facing towards the outside of the housing 407. The power management IC has one surface exposing to the outside of the power converter 400 and forming a part of the housing 407.

The power converter 400 further includes a component 406, e.g. an SMD component or other component, that connects the side substrates 402 electrically. The component 406 works as additional communication/current path between the two side substrates 402 such that the reliability of the power converter 400 is improved. By way of example, the component 406 provides redundant current paths and thermal transfer paths for the power converter 400.

Figure 5:
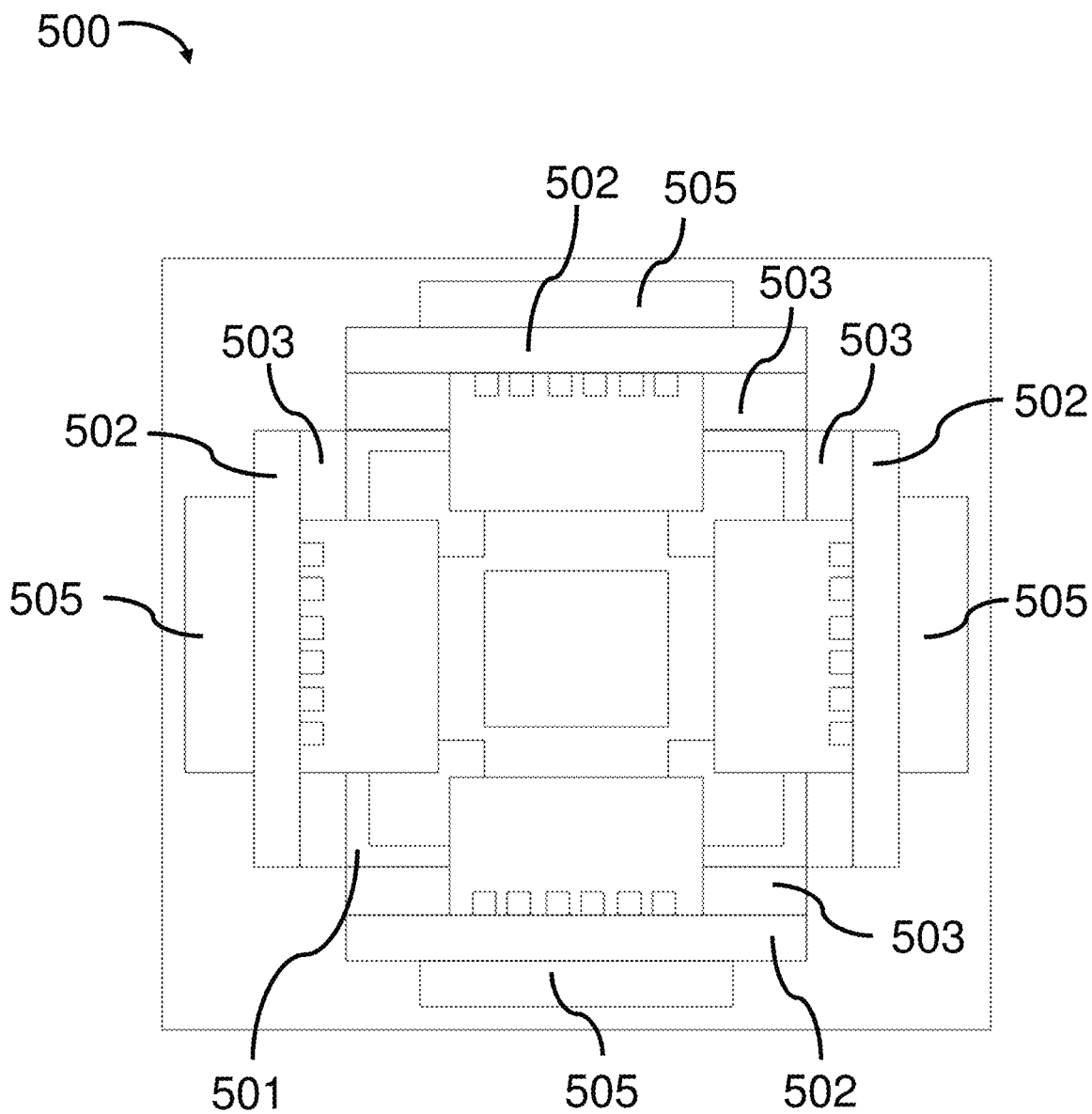
FIG. 5 is a top view of a power converter in accordance with an example embodiment.

FIG. 5 shows a top view of a power converter 500 in accordance with an example embodiment.

The power converter 500 includes a bottom substrate 501 that is rectangular and rigid. Four flexible substrates 503 are connected symmetrically with the bottom substrate 501 at the four sides of the bottom substrate 501, and the four side substrates 502 are electrically connected with the bottom substrate 501 by the flexible substrates 503. Each side substrate 502 forms an angle of 90° with the bottom substrate 501 and thus the four side substrates 502 are arranged peripherally and symmetrically around the bottom substrate 501. Each of the four side substrates 502 is mounted with one power switching circuit 505. The flexible substrates 503 provides redundant current paths and thermal transfer path for the power switching circuits 505 to improve the reliability of the power converter 500.

In one example embodiment, the bottom substrate 501 is connected with a plurality of SMDs that are rigid and of the same height, by which the bottom substrate 501 can be fixed on a circuit board with a precise distance. The soldering pads of the SMDs can be used as paths for either large power or small signals between the bottom substrate and the circuit board to transfer power. The SMDs can also provide redundant current paths and thermal transfer paths to increase the reliability of the power converter. By way of example, the SMDs may be passive components such as resistors, capacitors and etc.

In one example embodiment, the flexible substrates 503 have a smaller thickness than the rigid substrates including the bottom substrate 501 and the side substrate 502. For example, the flexible substrates 503 may be flexible printed circuitry (FPC) connectors that connects the bottom substrate 501 and the side substrate 502. In another example, the substrates adopt a laminate structure that the flexible substrates 503 may be a flexible dielectric material and the rigid substrates may include two rigid laminates made of prepreg with the flexible dielectric material sandwiched therebetween.

In one example embodiment, a heat spreader (not shown) is embedded in space formed by the bottom substrate 501 and the four side substrates 602 to dissipate heat to outside of the power converter 500.

Figure 6A:
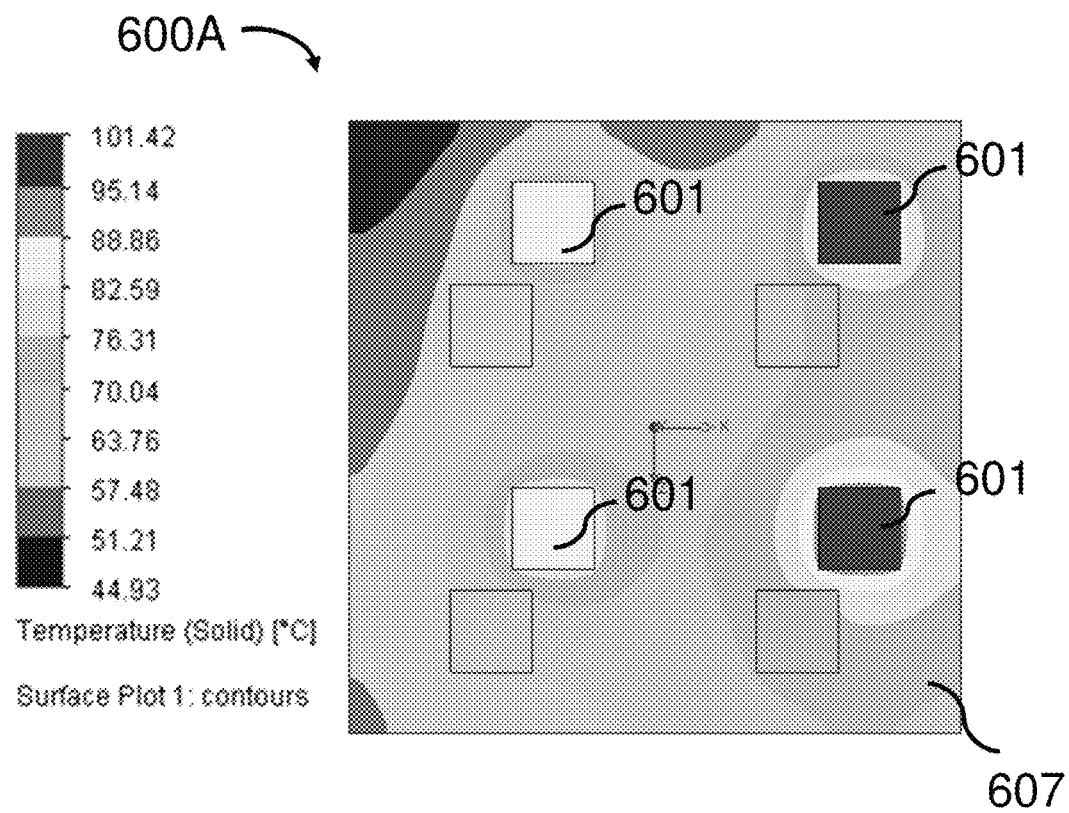
FIG. 6A is a graph of temperature distribution on a benchmark power converter.
Figure 6B:
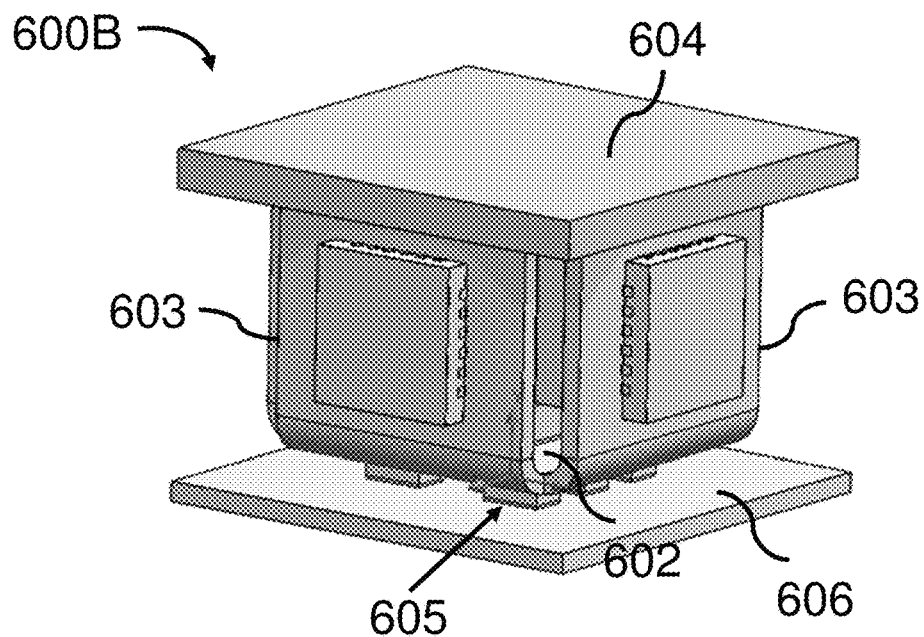
FIG. 6B is a graph of temperature distribution on a power converter in accordance with an example embodiment.

FIG. 6A and FIG. 6B show graphs of temperature distribution on a benchmark power converter 600A and that on a power converter 600B in accordance with an example embodiment 600B. FIG. 6B uses the same color scale that represents a range of temperature in FIG. 6A.

In FIG. 6A, the bench mark power converter 600A includes four power switching circuits distributed on a planar circuit board 607. In FIG. 6B, the power converter 600B has a 3D structure wherein four side substrates 603 are vertically connected with the bottom substrate 602. Four power switching circuits are distributed on the four side substrates 603 respectively. A heat spreader 604 is embedded in space formed by the bottom substrate 602 and the side substrates 603 to dissipate heat to outside of the power converter 600B. SMDs 605 of the same height are employed for height control between the bottom substrate 602 and the circuit board 606, and for transferring heat to the circuit board 606 as well.

As shown in FIG. 6A, the heat is mainly generated by the power management ICs 601 in the benchmark 600A and concentrates there around so that the ICs 601 have a much higher temperature than the other area. The maximum temperature for the bench mark 600A reaches 101.42° C., which appears on two of the power management ICs 601. That is, the temperature rises by 76.42° C. above the room temperature of 25° C.

For the power converter 600B in FIG. 6B, the thermal distribution is more even and the maximum temperature is 76.89° C., i.e., the temperature of the power converter 600B rises 51.89° C. from the room temperature, which is reduced by 32% comparing with the benchmark 600A. The example embodiment of the present invention achieves better thermal performance than the conventional planar design.

Further, the power converter 600B with the 3D structure can achieve a power density significantly greater than the benchmark. By way of example, the benchmark power converter 600A with four power switching circuits which can output a power of 90 W may be mounted on a planar PCB with a surface size of 30 mm×30 mm and a height of 4.7 cm, while a 3D power converter 600B having the same output can be integrated in a module with a much smaller bottom area of 10 mm×16 mm and a slightly larger height of 6.3 cm. The mounting area of the 3D power converter 600B is reduced by over 80% in planar dimension and the power density of the power converter 600B, i.e., power per unit volume, increases accordingly. For example, the power density of the benchmark 600A is 18.9 W/cm$^3$, while the power density of the 3D power converter 600B can reach 88.2 W/cm$^3$, which is approximately 4.7 times that of the benchmark.

Figure 7A:
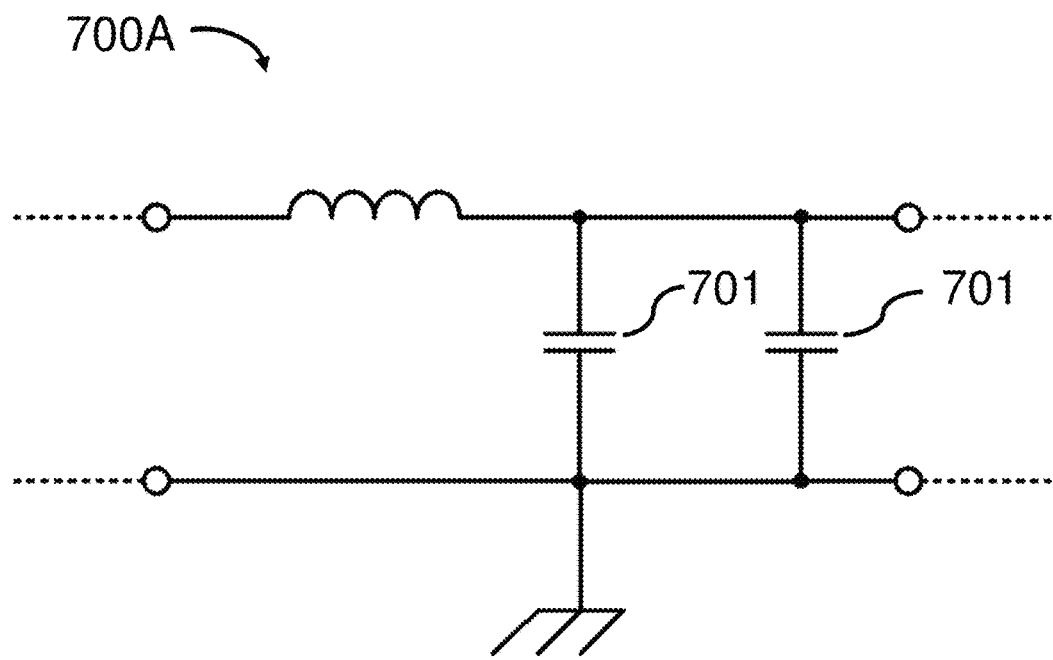
FIG. 7A is a filter circuit in accordance with an example embodiment.

FIG. 7A shows a filter circuit 700A in accordance with an example embodiment.

In one example embodiment, the power converter includes a filter circuit 701 on the output of the converter to reduce the level of switching noise or ripple. As shown in FIG. 7A, the filter circuit 700A is of L-C form and includes two capacitors 701, which provides redundant electrical paths in addition to the filtering function. By way of example, the capacitors 701 are SMDs of the same height and they are mounted between the bottom substrate and the PCB board to provide height control therebetween and replace the spacers as in the conventional power converter.

Figure 7B:
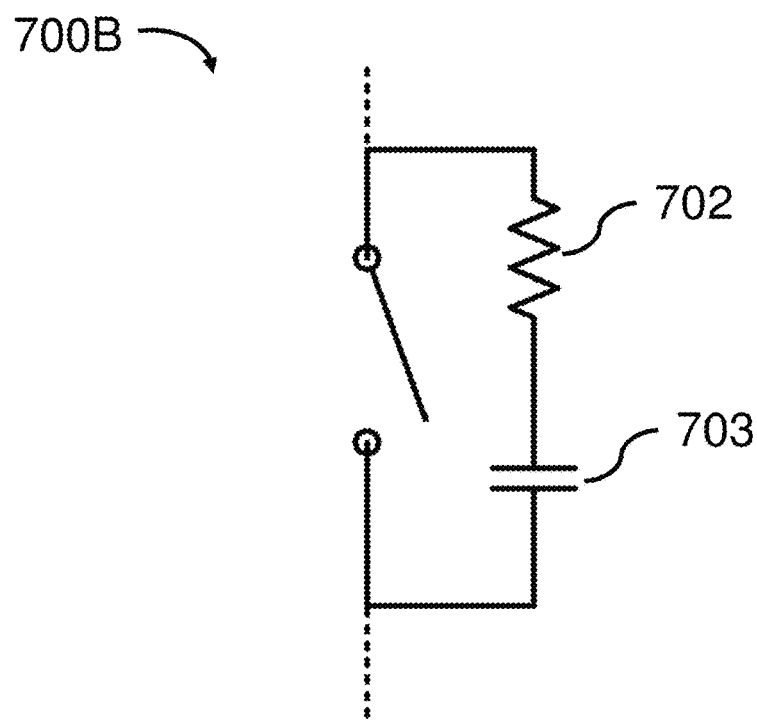
FIG. 7B is a snubber circuit in accordance with an example embodiment.

FIG. 7B shows a snubber circuit 700B in accordance with an example embodiment.

The snubber circuit 700B includes a small resistor 702 in series with a small capacitor 703. The snubber circuit 700B is used to suppress the rapid rise in voltage across a switching device, preventing the erroneous turn-on of the switching device by limiting the rate of rise in voltage across the switching device to a value which will not trigger it. By way of example, the resistor 702 and capacitor 703 are SMDs of the same height and they are mounted between the stacked bottom substrate and PCB board.

The exemplary embodiments of the present invention are thus fully described. Although the description referred to particular embodiments, it will be clear to one skilled in the art that the present invention may be practiced with variation of these specific details. The features in one example embodiment may be adopted or combined in another example embodiment. Hence this invention should not be construed as limited to the embodiments set forth herein.

For example, the shape of the bottom substrate is described as rectangular and the number of side substrates is described as four in FIG. 5 above, but it is clear that other shapes of the bottom substrate may be used according to the user's preference and the number of side substrates can be adjusted accordingly. Also, the angle between the bottom substrate and the side substrate is described as 90°, however, any angles between 30° to 150° may be used according to the requirement of the power converter design.

What is claimed is:

1. A power converter, comprising:
    a bottom substrate;
    a circuit board;
    a plurality of surface mounting devices that are rigid and of the same height, wherein the surface mounting devices include input/output capacitors and snubber circuits that are configured to connect the bottom substrate with the circuit board mechanically and electrically;
    at least one flexible substrate; and
    at least one side substrate that is connected with the bottom substrate by the flexible substrate and forms an angle with the bottom substrate;
    a power switching circuit that is mounted on the side substrate; and
    a housing that encapsulates the bottom substrate, the flexible substrate, the side substrate, and the power switching circuit,
    wherein the bottom substrate and the side substrate are rigid, the flexible substrate provides electrical connection between the bottom substrate and the side substrate,
    wherein the power switching circuit is mounted on an external surface of the side substrate that faces towards outside of the housing, and forms part of the housing.

2. The power converter of claim 1, wherein the bottom substrate has a thickness greater than the flexible substrate and the side substrate has a thickness greater than the flexible substrate.

3. The power converter of claim 1, further comprising:
    a heat spreader that is embedded between the side substrate and the housing to dissipate heat, wherein the heat spreader has a surface that forms part of the housing exposing to an outside of the power converter for dissipating heat.

4. The power converter of claim 1, wherein
    the power switching circuit is mounted on the side substrate and receives power through the surface mounting devices and the flexible substrate.

5. The power converter of claim 1, wherein the angle between the bottom substrate and the side substrate is in the range of 30° to 150°.

6. The power converter of claim 1, wherein the angle between the bottom substrate and the side substrate is 90°.

7. The power converter of claim 1, wherein the bottom substrate is of rectangular shape and each side of the bottom substrate is connected with one side substrate by the flexible substrate.

8. The power converter of claim 1, wherein the power switching circuit includes a power management IC that is mounted on the external side of the side substrate and faces towards an outside of the power converter.

9. The power converter of claim 1, wherein the bottom substrate is of rectangular shape and two opposite sides of the bottom substrate are connected with two side substrates respectively at the first ends by two flexible substrates, wherein the second ends of the side substrates are electronically interconnected by an additional surface mounting device.

10. A power converter, comprising:
    a plurality of surface mounting devices that are rigid and of the same height, wherein the surface mounting devices include input/output capacitors and snubber circuits;
    a bottom substrate that is rigid and is configured to be fixed on a circuit board by the plurality of surface mounting devices, wherein the surface mounting devices provide electrical connection between the circuit board and the bottom substrate;
    two side substrates that are rigid and connected to sides of the bottom substrate symmetrically by two flexible substrates, wherein each side substrate forms an angle of 90° with the bottom substrate;
    at least two power switching circuits that are mounted on each of the side substrates respectively and receiving power through the two flexible substrates and the plurality of the surface mounting devices;
    a housing that encapsulates the circuit board, the bottom substrate, the flexible substrates, the side substrates, the plurality of surface mounting devices and the at least two power switching circuits; and
    a heat spreader that is embedded between the two side substrates and has a surface that forms part of the housing exposing to an outside of the power converter for dissipating heat, wherein the power switching circuits are mounted on external surfaces of the side substrates that face towards the outside of the housing, and forms part of the housing.

11. The power converter of claim 10, wherein a thickness of the side substrate is greater than a thickness of the flexible substrate.

12. The power converter of claim 10, wherein the surface mounting devices are arrays including input/output capacitors and snubber circuit that provide electrical connection and redundant electrical paths between the bottom substrate and the circuit board.

13. The power converter of claim 10, wherein each of the power switching circuits includes a power management IC that is mounted on an external side of the side substrate that faces towards the outside of the power converter.

14. The power converter of claim 10, further comprising a power management IC mounted on a top surface of the bottom substrate.

15. A power converter that has a 3D structure for increasing power density and improving thermal performance, comprising:
   a plurality of surface mounting devices that are rigid and of the same height, wherein the surface mounting devices include input/output capacitors and snubber circuits;
   a bottom substrate that is rectangular and rigid, wherein the bottom substrate is configured to be fixed on a circuit board by the plurality of surface mounting devices and wherein the plurality of surface mounting devices provides electrical connection and redundant electrical paths between the bottom substrate and the circuit board;
   four flexible substrates that are connected symmetrically with the bottom substrate at the four sides of the bottom substrate;
   four side substrates that are electrically connected with the bottom substrate by the flexible substrates and each side substrate forms an angle of 90° with the bottom substrate;
   four power switching circuits that are mounted on each of the four side substrates;
   a heat spreader that is embedded in space formed by the bottom substrate and the side substrates; and
   a housing that encapsulates the bottom substrate, the flexible substrate, the side substrate, the power switching circuits, and the heat spreader,
   wherein the power switching circuits are mounted on external surfaces of the side substrates that face towards the outside of the housing, and forms part of the housing.

16. The power converter of claim 15, wherein each of the power switching circuits include a power controller IC that is mounted on an external surface of the side substrate that faces towards an outside of the power converter.

* * * * *